June 17, 1969 E. EUGSTER ET AL 3,449,826

PROCESS FOR MAKING A SEMICONDUCTOR ELEMENT

Filed Aug. 25, 1966

United States Patent Office 3,449,826
Patented June 17, 1969

3,449,826
PROCESS FOR MAKING A SEMICONDUCTOR ELEMENT

Eduard Eugster, Windisch, and Dieter Spickenreuther, Baden, Switzerland, assignors to Aktiengesellschaft Brown, Boveri & Cie, Baden, Switzerland, a joint-stock company Filed Aug. 25, 1966, Ser. No. 575,173
Claims priority, application Switzerland, Sept. 8, 1965, 12,525/65
Int. Cl. H01l 7/00, 7/02, 3/00
U.S. Cl. 29—589 5 Claims

ABSTRACT OF THE DISCLOSURE

A process for producing a semiconductor element of a shock-voltage-resistant semiconductor valve includes the steps of diffusing an opposite conductivity type endowment substance into a disc of weekly endowed semiconductor material of a first type conductivity to form a weakly endowed surface zone of a second type conductivity and producing a p-n transition zone. This surface zone is removed from the sides and one end face of the disc, after which a first metal disc containing a donor substance is alloyed into the n-type conductivity zone of the disc to form a highly endowed n+ zone, and then a second metal disc containing an acceptor substance is alloyed into the p-type conductivity zone to form a highly endowed p+ zone. Finally an electrically conductive carrier plate made of a metal having substantially the same thermal expansion coefficient as that of the semiconductor material is soldered to the first metal disc. The thickness of the weakly endowed zones is chosen sufficiently great so that the electric field strength at the p+-p and n-n+ junctions just before avalanche breakdown is less than 1 kv./cm. and the endowment gradient is greater than $10^{17}$ atoms/cm.$^3$/$\mu$m.

Figure 1:
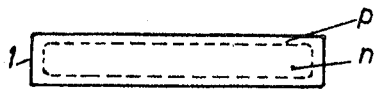

This invention relates to a semiconductor element of shock-voltage-resistant semiconductor valve and to a process for the production thereof.

Customary semiconductor valves have the disadvantage that when shock-voltages occur in the cut-off direction an avalanche breakdown often takes place, especially at the edges of the semiconductor disc. The resultant overheating leads to local melting of the semiconductor material, with the result that its cut-off property is impaired or may be completely lost. So-called shock-voltage-resistant semiconductor valves which do not exhibit the said disadvantage have now become known. Such a semiconductor valve may be achieved for example with the aid of a p+-i-n+ structure. In this connection, p+ and n+ signify highly endowed semiconductor zones with more than $10^{16}$ endowment atoms/cm.$^3$, and i signifies a high-resistance or very weakly endowed zone with fewer than $10^{13}$ endowment atoms/cm.$^3$.

Since the breakdown voltage in the case of this arrangement depends almost entirely on the thickness of the i zone, this thickness must exhibit a very high degree of constancy over the whole area of the valve if the breakdown current is to be distributed over the whole area as nearly uniformly as possible. However, such a high degree of constancy can be attained only with great technological difficulties, and only with valves of relatively small area, for example, smaller than 10 mm.$^2$.

In addition to this, experience has shown that shock-voltage-resistant semiconductor valves of this type suffer an undesirable change in their cut-off properties as operational time progresses, which change takes the form of an increase in current in the cut-off direction. In addition, these semiconductor valves can only be subjected to relatively small overloads without losing their rectifying properties.

The object of the invention is to provide a semiconductor element for a shock-voltage-resistant semiconductor valve which does not exhibit the said undesirable properties, and which is produced by a technologically simple process.

The process according to the invention comprises the following sequence of operational steps: diffusing endowment substance into a disc of weakly endowed semiconductor material ($10^{13}$–$10^{16}$ endowment atoms/cm.$^3$) exhibiting a first type of conduction, for the purpose of forming a weakly endowed surface zone (fewer than $10^{16}$ endowment atoms/cm.$^3$) exhibiting a second type of conduction differing from the first, with the result that a p-n transition is formed; removing, more particularly by lapping, this surface zone from the sides and one face of the disc; alloying a metal disc containing a donor substance on the zone exhibiting n-type conduction of the semiconductor disc for the purpose of forming a highly endowed n+ zone (more than $10^{16}$ donor atoms/cm.$^3$); alloying a metal disc containing an acceptor substance on to the zone exhibiting p-type conduction of the semiconductor disc, for the purpose of forming a highly endowed p+ zone (more than $10^{16}$ acceptor atoms/cm.$^3$); and soldering an electrically conductive carrier plate, made of a metal having substantially the same coefficient of thermal expansion as the semiconductor material, to the metal plate which is alloyed on to the zone exhibiting the second type of conduction.

The semiconductor element produced by this process is characterized in that the endowment gradient of the p-p+ and n-n+ transitions is greater than $10^{17}$ atoms/cm.$^3$/$\mu$m., and in that the endowment gradient of the p-n transition is smaller than $10^{14}$ atoms/cm.$^3$/$\mu$m., and in that the electric field strengths at the p-p+ and n-n+ transitions at avalanche breakdown are less than 1 kv./cm.

Figure 4:
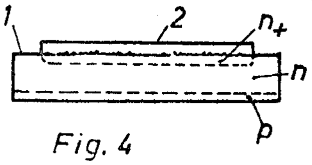
Figure 5:
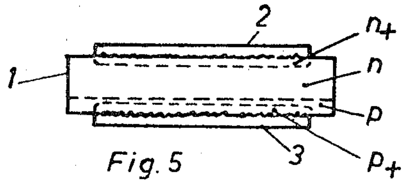
Figure 6:
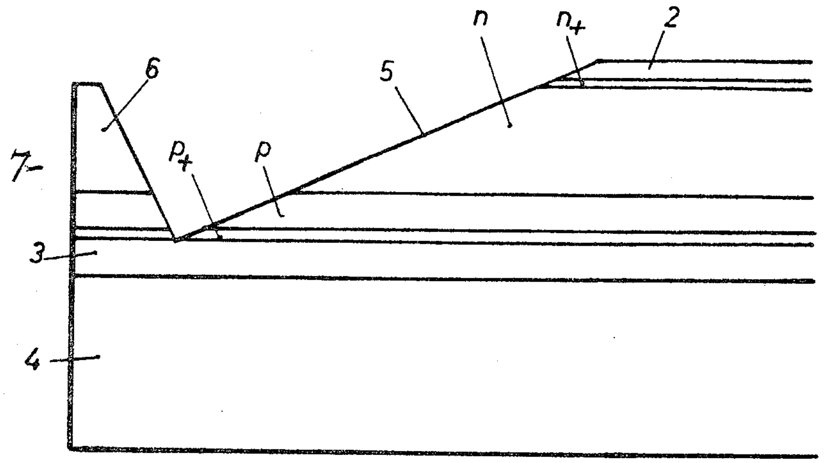

The invention is explained by way of example with reference to the appended drawing, in which:

FIGS. 1–5 graphically illustrate, in diagrammatic manner, the sequence of steps constituting the process of the invention; and FIG. 6 shows, in section, the edge zone of the finished semiconductor element.

In the case of the example hereinafter described, the starting point is a weakly endowed silicon disc 1 exhibiting n-type conduction and with a thickness of about 300 $\mu$m. The endowment of the silicon may amount to between $10^{13}$–$10^{16}$ donor atoms/c.$^3$. In order to form a p-n transition in the silicon disc 1, aluminum—which serves as an acceptor substance—is diffused in the disc at about 1300° C. in intrinsically known manner so that, as shown in Figure 1, a weakly endowed surface zone exhibiting p-type conduction, and having a thickness of about 80 $\mu$. and an endowment of fewer than $10^{16}$ acceptor atoms, is produced in the silicon disc.

Figure 2:
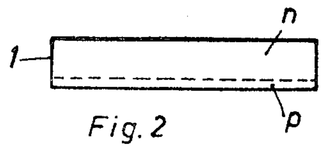

This zone of p-type conduction is then removed from one of the faces and from the sides, for example, by lapping. FIGURE 2 shows the silicon disc thus produced with a p-n transition.

Figure 3:
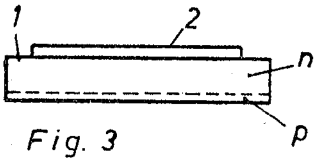

In order to form a highly endowed n+ zone on the weakly endowed zone of n-type conduction and a highly endowed p+ zone on the weakly endowed zone of p-type conduction, the so-called alloying-on process illustrated with the aid of FIGURES 3 to 5 is used in two further steps of the process.

FIGURE 3 shows the silicon disc 1 with the n-p transition, which disc, together with a disc 2 of a gold-antimony alloy, is brought for a few minutes to a temperature at which the molten alloy dissolves a definite quantity of silicon. The quantity of dissolved silicon depends on the temperature and quantity of applied alloy. Upon cooling, the disolved silicon is separated out again, and is deposited again on the silicon disc 1 in substantially monocrystalline form. According to its solubility in solid silicon, certain quantities of the alloy components remain incorporated in the re-crystallization zone. FIGURE 4 shows the system after cooling has taken place. Since the solubility of gold in solid silicon is negligible, practically only a well-defined quantity of antimony remains behind as the donor substance in the re-crystallization zone, which in this way forms a highly endowed n+ zone with more than $10^{16}$ donor atoms/m.$^3$ (sic).

Alloying on an aluminum disc 3 in similar manner forms a highly endowed p+ zone with more than $10^{16}$ acceptor atoms/cm.$^3$ in the form of a re-crystallization zone in which aluminum remains behind as the acceptor substance. FIGURE 5 shows the intermediate product after the two alloying procedures.

The semiconductor element is thereafter completed in intrinsically known manner. FIGURE 6 shows, in section, the edge zone 7 of the finished semiconductor element. A molybdenum carrier plate 4, which serves for mechanical reinforcement of the semiconductor element, is soldered on to the aluminum disc 3 of the intermediate product illustrated in FIGURE 5. Tungsten may also be used as the material for the carrier plate instead of molybdenum. Finally, an area 5 is mechanically treated to form the surface of a conical frustum adjoining all the zones of the semiconductor material, this being done in order to lengthen the creep path at the edge zone of the semiconductor disc. This mechanical treatment is preferably carried out with the aid of ultrasonics. In addition to this, an annular zone 6, which imparts increased mechanical strength to the edge zone 7, is produced when the area 5 is being formed.

In a second variant of the production process, the starting point is a semiconductor disc exhibiting p-type conduction, the zone of n-type conduction being formed by diffusing donor substance into it. The remaining steps of the process follow in similar manner.

The P+-p-n-n+ structure thus formed exhibits a plurality of advantages. The two transition, p+-p and n-n+, are decisive as regards the conduction function. Because of the alloying-on process, they exhibit a large endowment gradient of more than $10^{17}$ endowment atoms/cm.$^3$/$\mu$m., which leads to a good minority injection factor.

The p-n transition of the structure serves for the cut-off function. Because of the diffusion process used, the endowment gradient in this case is less than $10^{14}$ endowment atoms/cm.$^3$/$\mu$m., with the result that a good cut-off property is ensured.

The space-charge distribution determined by the endowment profile generates an electric field which exhibits its maximum strength at the p-n transition. On account of the relatively small endowment gradient, the electric field strength varies only to a relatively small extent in the vicinity of its maximum. The consequence of this is that when an avalanche breakdown occurs the dissipated power is absorbed in a relatively wide zone embracing the p-n transition. In addition to this, the diffusion process ensures an endowment profile which is uniformly well defined over the area of the semiconductor, which leads to uniform distribution of power dissipation over the whole area of the semiconductor.

The consequence of these properties of the p-n transition is that for a given permissible power-dissipation density the semiconductor element can dissipate at least as much power in the cut-off direction as in the conductive direction.

In order to prevent the p+-p and n-n+ transistions from affecting the start of an avalanche breakdown, the electric field strength at these transistions must not exceed the value of 1 kv./cm. In order to achieve this, it is sufficient to make the weakly endowed zones sufficiently thick.

We claim:

1. Process for the production of a semiconductor element of a shock-voltage-resistant semiconductor valve, which comprises the steps of:

(a) diffusing an opposite conductivity type endowment substance into a disc of weakly endowed semiconductor material of $10^{13}$–$10^{16}$ endowment atoms/cm.$^3$ of a first type conductivity to form a weakly endowed surface zone having a concentration of less than $10^{16}$ endowment atoms/cm.$^3$ of a second type conductivity and producing a p-n transition zone in said disc, the endowment gradient of said transition zone being less than $10^{14}$ atoms/cm.$^3$/$\mu$m., (b) removing said surface zone from the sides and one end face of said disc, (c) alloying a first metal disc containing a donor substance into the n-type conductivity zone of said disc to form a highly endowed n+ zone having a concentration of more than $10^{16}$ donor atoms/cm.$^3$, (d) alloying a second metal disc containing an acceptor substance into the p-type conductivity zone of said disc to form a highly endowed p+ zone having a concentration of more than $10^{16}$ acceptor atoms/cm.$^3$, (e) said weakly endowed zones being formed with means, including selected thicknesses thereof, for producing just before avalanche breakdown, an electric field strength at the p+-p and n-n+ junctions less than 1 kv./cm. and an endowment gradient therein greater than $10^{17}$ atoms/cm.$^3$/$\mu$m., and (f) soldering an electrically conductive carrier plate, of a metal having substantially the same coefficient of thermal expansion as said semiconductive material, to said first metal disc.

2. The process defined in claim 1, to which is added the step of removing a portion of semiconductor material for the purpose of forming an edge area in the form of the surface of a conical frustum adjoining all the zones of the semiconductor material, and having its base disposed towards the carrier plate.

3. The process defined in claim 1, in which the semiconductor valve consists substantially of silicon.

4. The process defined in claim 1, in which said second metal disc which contains an acceptor substance is made of aluminum.

5. The process defined in claim 1, in which said first metal disc which contains a donor substance is made of a gold-antimony alloy.

References Cited

UNITED STATES PATENTS

| | | | |
|---|---|---|---|
| 2,989,650 | 6/1961 | Doucette et al. | 317—234 X |
| 2,993,155 | 7/1961 | Gotzberger | 317—234 X |
| 3,179,860 | 4/1965 | Clark et al. | 317—23 X |

JAMES D. KALLAM, *Primary Examiner.*

U.S. Cl. X.R.

317—234